United States Patent
Joardar et al.

(10) Patent No.: US 12,408,311 B2
(45) Date of Patent: Sep. 2, 2025

(54) COMBINED LIQUID AND AIR COOLED POWER ELECTRONICS ASSEMBLY

(71) Applicant: Carrier Corporation, Palm Beach Gardens, FL (US)

(72) Inventors: Arindom Joardar, Jamesville, NY (US); Lokanath Mohanta, Liverpool, NY (US); Konstantin Borisov, Avon, CT (US); Ismail Agirman, Southington, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 218 days.

(21) Appl. No.: 18/051,963

(22) Filed: Nov. 2, 2022

(65) Prior Publication Data
US 2023/0301042 A1    Sep. 21, 2023

Related U.S. Application Data

(60) Provisional application No. 63/274,762, filed on Nov. 2, 2021.

(51) Int. Cl.
*H05K 7/20*        (2006.01)

(52) U.S. Cl.
CPC ......... *H05K 7/20936* (2013.01); *H05K 7/209* (2013.01)

(58) Field of Classification Search
None
See application file for complete search history.

(56) References Cited

U.S. PATENT DOCUMENTS

| | | | | |
|---|---|---|---|---|
| 7,876,561 B2 * | 1/2011 | Schnetzka | ............... | H02P 29/50 |
| | | | | 361/699 |
| 9,276,516 B2 * | 3/2016 | Harada | ................. | F25B 31/006 |
| 10,369,863 B2 * | 8/2019 | Connell | ............... | F25B 43/006 |
| 10,925,181 B2 | 2/2021 | Kim et al. | | |
| 11,439,039 B2 * | 9/2022 | Nayak | .................... | H01L 23/473 |
| 11,486,613 B2 * | 11/2022 | Yuasa | ..................... | F25B 31/02 |
| 11,557,521 B2 * | 1/2023 | Harada | ............. | H05K 7/20927 |
| 11,602,044 B2 * | 3/2023 | Zhou | .................. | H05K 7/20254 |
| 2008/0266802 A1 | 10/2008 | Weiss et al. | | |
| 2008/0295535 A1 | 12/2008 | Robinet et al. | | |
| 2012/0257354 A1 * | 10/2012 | Dede | ..................... | H01L 23/473 |
| | | | | 361/689 |

(Continued)

OTHER PUBLICATIONS

European Search Report for European Applicaiton No. 22204869.6; dated Mar. 17, 2023; 80 pages.

*Primary Examiner* — Courtney L Smith
(74) *Attorney, Agent, or Firm* — CANTOR COLBURN LLP (57) ABSTRACT

A power electronics assembly includes one or more power electronics devices, and a heat exchanger to which the one or more power electronics devices are mounted. The heat exchanger includes a heat exchanger body, and one or more fluid pathways extending through the heat exchanger body, the heat exchanger configured to transfer thermal energy from the one or more power electronics devices into a flow of fluid passing through the one or more fluid pathways. A plurality of fins extend from an outer surface of the heat exchanger body. The flow of fluid is a flow of liquid refrigerant diverted from a condenser of a heating, ventilation, and air conditioning (HVAC) system.

20 Claims, 5 Drawing Sheets

(56) References Cited

U.S. PATENT DOCUMENTS

| | | |
|---|---|---|
| 2015/0096719 A1 | 4/2015 | Moskaitis et al. |
| 2018/0257480 A1 * | 9/2018 | Zhou et al. |
| 2020/0053912 A1 * | 2/2020 | Kim .................. H05K 7/20336 |
| 2023/0025136 A1 * | 1/2023 | Yamada ................ F25B 49/022 |

* cited by examiner

COMBINED LIQUID AND AIR COOLED POWER ELECTRONICS ASSEMBLY

CROSS-REFERENCE TO RELATED APPLICATIONS

This application claims the benefit of U.S. Provisional Patent Application No. 63/274,762 filed Nov. 2, 2021, the disclosure of which is incorporated herein by reference in its entirety.

BACKGROUND

Exemplary embodiments pertain to the art of heat exchangers, and more particularly to heat exchangers for cooling power electronics.

Power electronics devices such as motor drives generate waste heat during operation of the device. Additionally, when the power electronics devices heat up the operational efficiency of the devices can degrade adding to the amount of heat generated. When utilized in a refrigeration system to drive, for example, a compressor of the refrigeration system, effective thermal integration of these devices can be important aspect to the system's overall efficiency and reliability. Consequently, a goal of the system integrator is to maintain these components within a range of operating temperatures which will maximize the system efficiency. One means of integrated cooling is to provide refrigerant from the refrigeration system to cool the power electronics. However, when you startup or shutdown the refrigeration system there may not be enough liquid circulating to cool the power electronics, which may lead to overheating during startup/shutdown. One way to mitigate this issue is to provide a dedicated pump to ensure liquid is available during these times, but this is an expensive solution. Accordingly, there remains a need in the art for a more effective solution to provide integrated cooling for the power electronics that ensures, or at least mitigates, overheating during startup/shutdown.

BRIEF DESCRIPTION

In one embodiment, a power electronics assembly includes one or more power electronics devices, and a heat exchanger to which the one or more power electronics devices are mounted. The heat exchanger includes a heat exchanger body, and one or more fluid pathways extending through the heat exchanger body, the heat exchanger configured to transfer thermal energy from the one or more power electronics devices into a flow of fluid passing through the one or more fluid pathways. A plurality of fins extend from an outer surface of the heat exchanger body. The flow of fluid is a flow of liquid refrigerant diverted from a condenser of a heating, ventilation, and air conditioning (HVAC) system.

Additionally or alternatively, in this or other embodiments the one or more power electronics devices are secured to a first outer surface of the heat exchanger body, and the plurality of fins extend from a second outer surface of the heat exchanger body different from the first outer surface.

Additionally or alternatively, in this or other embodiments the second outer surface is opposite the first outer surface.

Additionally or alternatively, in this or other embodiments the heat exchanger body is formed from two or more plates secured at a mating surface.

Additionally or alternatively, in this or other embodiments each plate includes a portion of the one or more fluid pathways.

Additionally or alternatively, in this or other embodiments the one or more power electronics devices includes a variable frequency drive of a heating, ventilation, and air conditioning (HVAC) system.

In another embodiment, a power electronics assembly includes one or more power electronics devices, and a housing including two or more housing walls to partially enclose the one or more power electronics devices. A housing wall of the two or more housing walls is configured as a heat exchanger. The heat exchanger includes a heat exchanger body and one or more fluid pathways extending through the heat exchanger body, the heat exchanger configured to transfer thermal energy from the one or more power electronics devices into a flow of fluid passing through the one or more fluid pathways. A plurality of fins extend from an outer surface of the heat exchanger body. The flow of fluid is a flow of liquid refrigerant diverted from a condenser of a heating, ventilation, and air conditioning (HVAC) system.

Additionally or alternatively, in this or other embodiments the one or more power electronics devices are secured to a first outer surface of the heat exchanger body, and the plurality of fins extend from a second outer surface of the heat exchanger body different from the first outer surface.

Additionally or alternatively, in this or other embodiments the second outer surface defines an exterior surface of the housing.

Additionally or alternatively, in this or other embodiments the second outer surface is opposite the first outer surface.

Additionally or alternatively, in this or other embodiments the heat exchanger body is formed from two or more plates secured at a mating surface.

Additionally or alternatively, in this or other embodiments each plate includes a portion of the one or more fluid pathways.

Additionally or alternatively, in this or other embodiments the one or more power electronics devices includes a variable frequency drive of a heating, ventilation, and air conditioning (HVAC) system.

In yet another embodiment, a method of cooling one or more power electronics devices includes securing the one or more power electronics devices to a heat exchanger, the heat exchanger including one or more fluid pathways and a plurality of fins. Circulating a flow of fluid through one or more fluid pathways to transfer thermal energy from the one or more power electronics to the flow of fluid passing through the one or more fluid pathways. The thermal energy is dissipated from the heat exchanger via the plurality of fins extending from an outer surface of the heat exchanger. The flow of fluid is a flow of liquid refrigerant diverted from a condenser of a heating, ventilation, and air conditioning (HVAC) system.

Additionally or alternatively, in this or other embodiments the one or more power electronics devices are secured to a first outer surface of the heat exchanger body, and the plurality of fins extend from a second outer surface of the heat exchanger body different from the first outer surface.

Additionally or alternatively, in this or other embodiments the second outer surface is opposite the first outer surface.

Additionally or alternatively, in this or other embodiments the heat exchanger body is formed from two or more plates secured at a mating surface.

Additionally or alternatively, in this or other embodiments each plate includes a portion of the one or more fluid pathways.

Additionally or alternatively, in this or other embodiments the one or more power electronics devices includes a variable frequency drive of a heating, ventilation, and air conditioning (HVAC) system.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
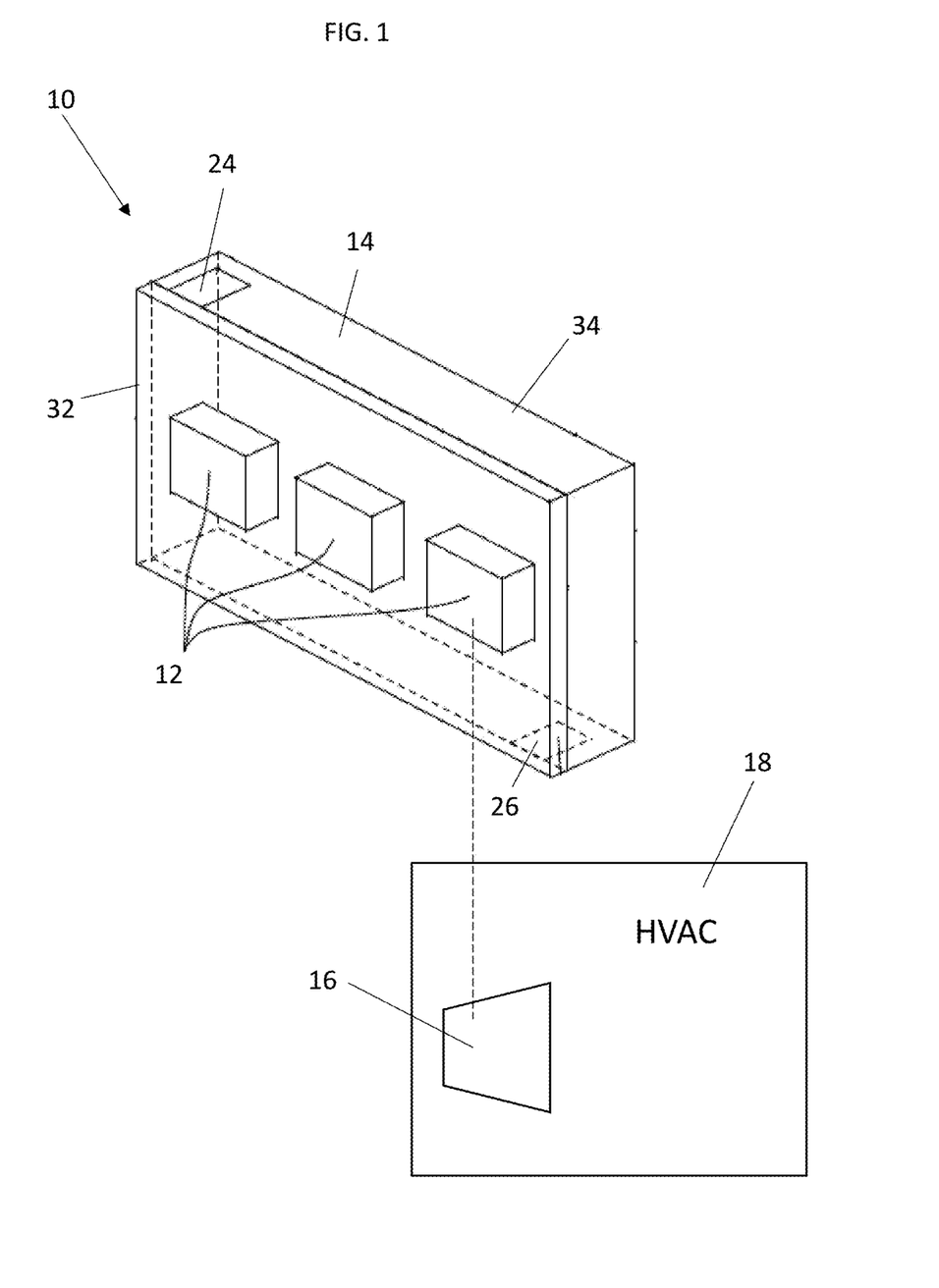
FIG. 1 is an illustration of an embodiment of a power electronics assembly.

Illustrated in FIG. 1 is an embodiment of a power electronics assembly 10. The power electronics assembly 10 includes one or more power electronics devices 12 mounted to a heat exchanger 14 utilized to reject and dissipate thermal energy generated by the power electronics devices 12 during operation. In some embodiments, the power electronics devices 12 include a variable frequency drive (VFD) operably connected to a compressor 16 of a heating, ventilation, and air conditioning (HVAC) system 18.

Figure 2:
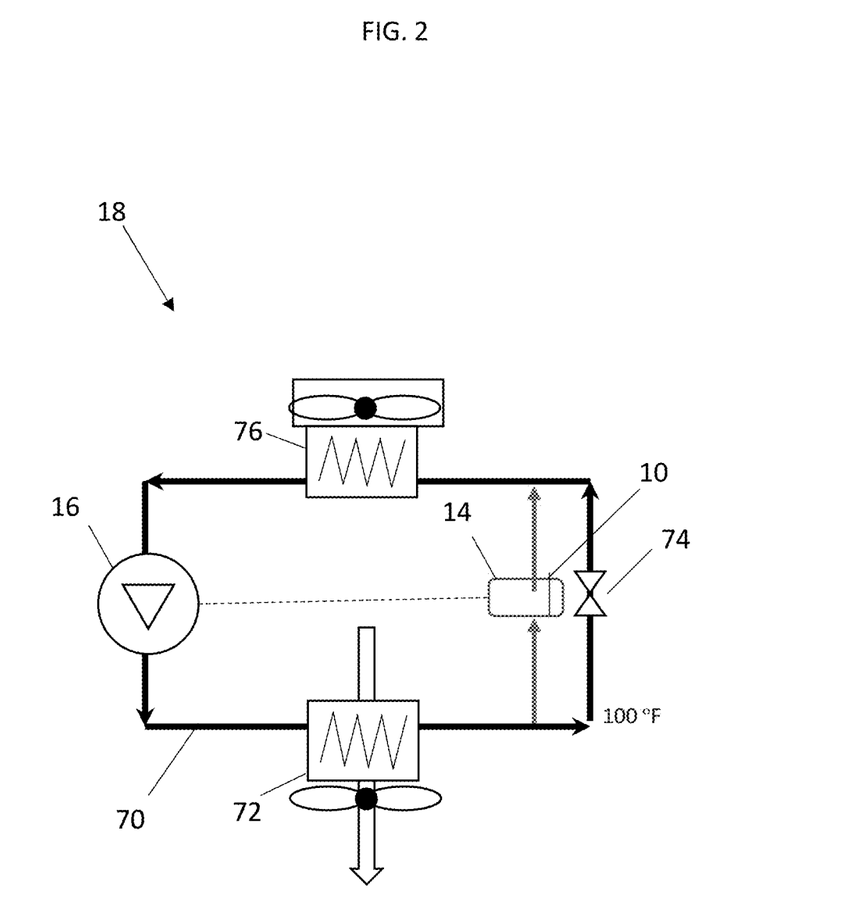
FIG. 2 is an illustration of an embodiment of a heating, ventilation, and air conditioning (HVAC) system.

Referring to FIG. 2, the HVAC system 18 includes, for example, a vapor compression circuit 70 including the compressor 16, a condenser 72, an expansion device 74 and an evaporator 76 arranged in series and having a volume of refrigerant flowing therethrough. The power electronics assembly 10 is connected to the vapor compression circuit 70 such that a portion of the flow of liquid refrigerant exiting the condenser 72 is diverted through the heat exchanger 14, bypassing the expansion device 74 and is directed from the heat exchanger 14 to the evaporator 76. The liquid refrigerant from the condenser 72 absorbs thermal energy generated by the power electronics devices 12. This thermal energy generated by the power electronics devices 12 may cause the refrigerant passing through the heat exchanger 14 to boil, changing phase of the refrigerant from liquid to vapor inside the heat exchanger 14.

Figure 3:
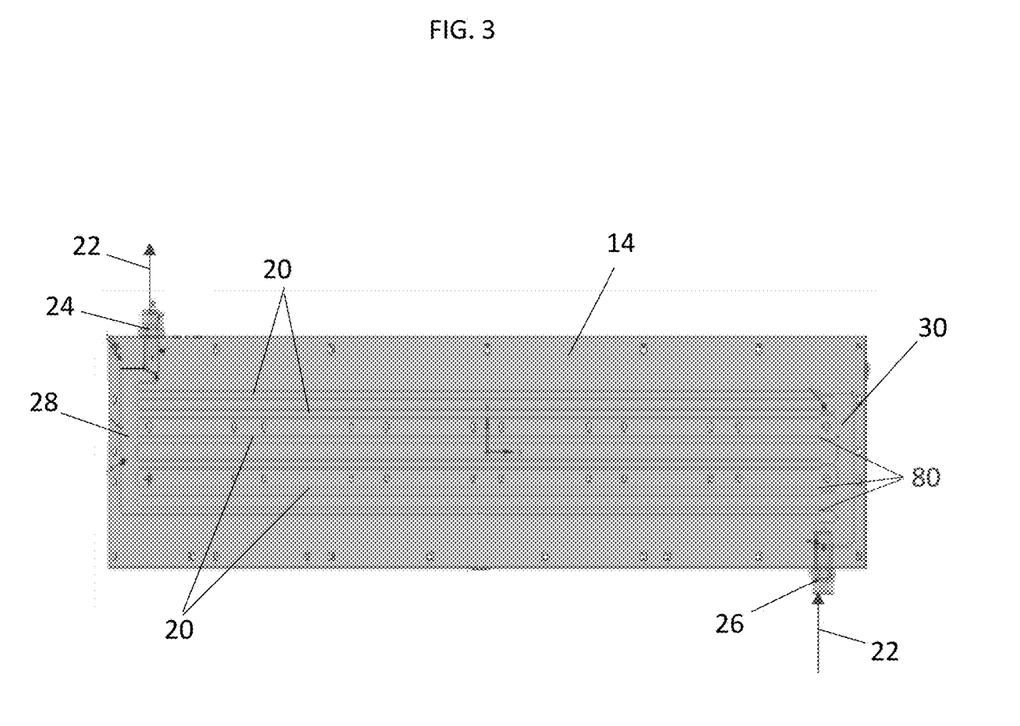
FIG. 3 is an illustration of an embodiment of a heat exchanger of a power electronics assembly.

Referring now to FIG. 3, an exemplary heat exchanger 14 is illustrated in more detail. As shown, the heat exchanger 14 includes a plurality of enclosed fluid pathways 20 extending therethrough, enabling a flow of fluid 22 such as, for example, refrigerant, glycol, or water to flow therein. The fluid pathways 20 extend between a heat exchanger inlet 26 through which the flow of fluid 22 enters the heat exchanger 14, and a heat exchanger outlet 24 through which the flow of fluid 22 exits the heat exchanger 14. The heat exchanger inlet 26 is connected to the fluid pathways 20 via an inlet manifold 30 to distribute the flow of fluid 22 to the fluid pathways 20, and similarly the heat exchanger outlet 24 is connected to the fluid pathways 20 via an outlet manifold 28. Immediately downstream of the inlet manifold 30, orifices 80 of different diameters, increasing with increasing distance from the heat exchanger inlet 26 are provided to distribute the flow of fluid 22 from the inlet manifold 30 equally among all of the fluid pathways 20. The enhancement features described in the following text will be in the fluid pathways 20 downstream of the respective orifices 80.

In some embodiments, the heat exchanger 14 is formed from a metal material, such as aluminum, aluminum alloy, steel, steel alloy, copper, copper alloy, or the like, and referring again to FIG. 1, may be formed from two or more plates 32, 34 abutting one another along a side and joined using any suitable means such as brazing, welding, clamping, compressing, bolting, and the like. The plates 32, 34 may each include a portion of the fluid pathways 20, the inlet manifold 30, the outlet manifold 28, the heat exchanger inlet 26 and/or the heat exchanger outlet 24 formed therein. The mating surfaces of the plates 32, 34 can be configured to correspond to one another, e.g., to fit together and seal the fluid circuit therebetween. The mating surfaces of the plates 32, 34 can include precision surfaces formed from a process having highly accurate and precise dimensional control, such as through computer numerical control (CNC) machining process and/or net shape, or near net shape manufacturing process. Optionally or additionally, a sealing material can be disposed between the plates 32, 34 to aide in preventing leakage from the fluid circuit.

In operation, the flow of fluid 22, liquid refrigerant from the condenser 72, enters the heat exchanger 14 at the heat exchanger inlet 26 and is distributed to the fluid pathways 20 via the inlet manifold 30. The heat exchanger 14 conducts thermal energy from the power electronics devices 12 and thermal energy is exchanged with the flow of fluid 22 flowing through the fluid pathways 20, resulting in cooling of the power electronics devices 12. The vapor flow of fluid 22 is then collected at the outlet manifold 28 and exits the heat exchanger 14 at the heat exchanger outlet 24.

In the present disclosure, features of the heat exchanger 14 are disclosed which improve performance of the heat exchanger 14, many of which are features to improve boiling performance of the flow of fluid 22, the refrigerant from the condenser 72. The flow of fluid 22 provided to the heat exchanger 14 may be diverted from the condenser 72 and in some embodiments enters the heat exchanger 14 in a liquid phase with 0% vapor quality or up to 20% vapor quality. The presently disclosed heat exchanger 14 may be operated to ensure the vapor quality of the flow of fluid 22 exiting the heat exchanger 14 has a vapor quality of from about 25% to about 80%, or in another embodiment from about 40% to about 60%, or in yet another embodiment from about 45% to about 55%, or about 50%. The vapor quality change happens as the heat from power electronics devices 12 is absorbed by the flow and used for phase change of the liquid refrigerant to vapor while travelling from the heat exchanger inlet 26 to the heat exchanger outlet 24.

Figure 4:
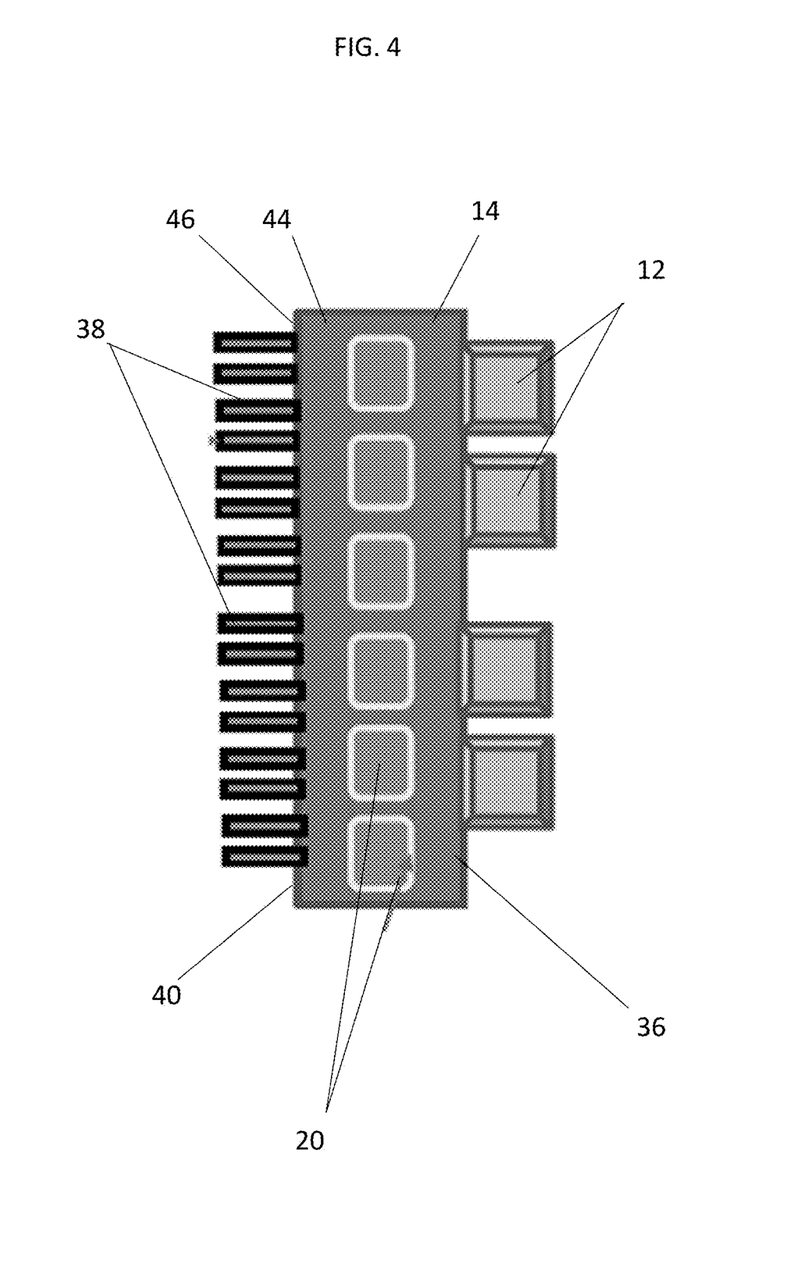
FIG. 4 is a cross-sectional view of an embodiment of a heat exchanger.
Figure 5:
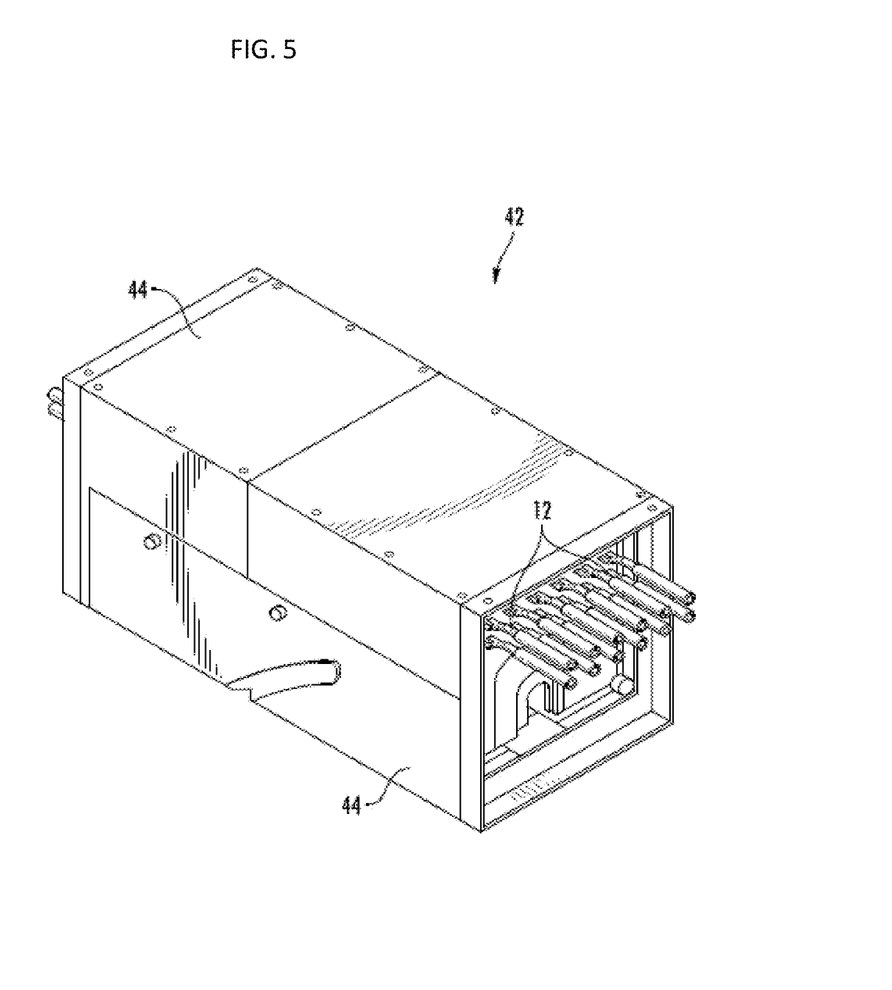
FIG. 5 is a perspective view of an embodiment of an enclosed power electronics assembly.

As shown in FIGS. 4 and 5, the power electronics devices 12 may be secured to a first lateral side 36 of the heat exchanger 14, and a plurality of fins 38 may extend from a second lateral side 40 of the heat exchanger 14, opposite the first lateral side 36. The plurality of fins 38 extend outwardly from the second lateral side 40 and aid in dissipating heat from the power electronics devices 12 and the heat exchanger 14 via airflow passing through the plurality of fins 38.

The power electronics devices 12 are packaged in a housing 42 that has a plurality of housing walls 44 at least partially enclosing the power electronics devices 12. At least one housing wall 44 may be configured as a heat exchanger 14, having the fluid pathways 20 embedded in the housing wall 44 and the plurality of fins 38 extending outwardly from an exterior housing wall surface 46. The heat exchangers 14 serving as the housing walls 44 may allow the heat exchanger 14 to serve as both a structural element for mounting the power electronics devices 12, and as components of the housing 42. The configuration may ensure that the second lateral side 40 and the plurality of fins 38 are exposed to ambient air and rejects heat via natural convection when the flow of fluid 22 through the plurality of fluid pathways 20 is not established, such as during system startup or shutdown. Further, in configurations where more than one housing wall 44 is configured as a heat exchanger 14 surface area for heat rejection may greatly increase.

By configuring one or more housing walls 44 as heat exchangers 14, cost of the power electronics assembly 10 may be reduced by eliminating the separator housing walls, and volume and performance of the assembly 10 is improved due to improved cooling performance and boiling of the flow of fluid 22 in the heat exchanger 14.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A power electronics assembly, comprising:
   one or more power electronics devices; and
   a heat exchanger to which the one or more power electronics devices are mounted, the heat exchanger comprising:
   a heat exchanger body;
   one or more fluid pathways extending through the heat exchanger body, the heat exchanger configured to transfer thermal energy from the one or more power electronics devices into a flow of fluid passing through the one or more fluid pathways; and
   a plurality of fins extending from an outer surface of the heat exchanger body;
   wherein the flow of fluid is a flow of liquid refrigerant diverted from a condenser of a heating, ventilation, and air conditioning (HVAC) system, bypassing an expansion device of the HVAC system;
   wherein a heat exchanger inlet of the heat exchanger is fluidly connected to the HVAC system between the condenser and the expansion device; and
   wherein a heat exchanger outlet of the heat exchanger is fluidly connected to the HVAC system between the expansion device and an evaporator of the HVAC system.

2. The power electronics assembly of claim 1, wherein the one or more power electronics devices are secured to a first outer surface of the heat exchanger body, and the plurality of fins extend from a second outer surface of the heat exchanger body different from the first outer surface.

3. The power electronics assembly of claim 2, wherein the second outer surface is opposite the first outer surface.

4. The power electronics assembly of claim 1, wherein the heat exchanger body is formed from two or more plates secured at a mating surface.

5. The power electronics assembly of claim 4, wherein each plate comprises a portion of the one or more fluid pathways.

6. The power electronics assembly of claim 1, wherein the one or more power electronics devices comprises a variable frequency drive of the HVAC system.

7. A power electronics assembly, comprising:
   one or more power electronics devices;
   a housing comprising two or more housing walls to partially enclose the one or more power electronics devices;
   wherein a housing wall of the two or more housing walls is configured as a heat exchanger, the heat exchanger comprising:
   a heat exchanger body; and
   one or more fluid pathways extending through the heat exchanger body, the heat exchanger configured to transfer thermal energy from the one or more power electronics devices into a flow of fluid passing through the one or more fluid pathways; and
   a plurality of fins extending from an outer surface of the heat exchanger body;
   wherein the flow of fluid is a flow of liquid refrigerant diverted from a condenser of a heating, ventilation, and air conditioning (HVAC) system, bypassing an expansion device of the HVAC system;
   wherein a heat exchanger inlet of the heat exchanger is fluidly connected to the HVAC system between the condenser and the expansion device; and
   wherein a heat exchanger outlet of the heat exchanger is fluidly connected to the HVAC system between the expansion device and an evaporator of the HVAC system.

8. The power electronics assembly of claim 7, wherein the one or more power electronics devices are secured to a first outer surface of the heat exchanger body, and the plurality of fins extend from a second outer surface of the heat exchanger body different from the first outer surface.

9. The power electronics assembly of claim 7, wherein the second outer surface defines an exterior surface of the housing.

10. The power electronics assembly of claim 8, wherein the second outer surface is opposite the first outer surface.

11. The power electronics assembly of claim 7, wherein the heat exchanger body is formed from two or more plates secured at a mating surface.

12. The power electronics assembly of claim 11, wherein each plate comprises a portion of the one or more fluid pathways.

13. The power electronics assembly of claim 7, wherein the one or more power electronics devices comprises a variable frequency drive of the HVAC system.

14. A method of cooling one or more power electronics devices, comprising:
- securing the one or more power electronics devices to a heat exchanger, the heat exchanger comprising one or more fluid pathways and a plurality of fins;
- circulating a flow of fluid through one or more fluid pathways to transfer thermal energy from the one or more power electronics to the flow of fluid passing through the one or more fluid pathways; and
- dissipating the thermal energy from the heat exchanger via the plurality of fins extending from an outer surface of the heat exchanger;
- wherein the flow of fluid is a flow of liquid refrigerant diverted from a condenser of a heating, ventilation, and air conditioning (HVAC) system, bypassing an expansion device of the HVAC system;
- wherein a heat exchanger inlet of the heat exchanger is fluidly connected to the HVAC system between the condenser and the expansion device; and
- wherein a heat exchanger outlet of the heat exchanger is fluidly connected to the HVAC system between the expansion device and an evaporator of the HVAC system.

15. The method of claim 14, wherein the one or more power electronics devices are secured to a first outer surface of the heat exchanger body, and the plurality of fins extend from a second outer surface of the heat exchanger body different from the first outer surface.

16. The method of claim 15, wherein the second outer surface is opposite the first outer surface.

17. The method of claim 14, further comprising forming the heat exchanger body from two or more plates secured at a mating surface.

18. The method of claim 17, wherein each plate comprises a portion of the one or more fluid pathways.

19. The method of claim 14, wherein the one or more power electronics devices comprises a variable frequency drive of the HVAC system.

20. The power electronics assembly of claim 1, wherein:
- the one or more fluid pathways is two or more fluid pathways;
- the heat exchanger includes an inlet manifold connecting the heat exchanger inlet to the two or more fluid pathways;
- wherein a plurality of orifices connect the inlet manifold to the two or more fluid pathways, the plurality of orifices having an increasing orifice diameter with increasing distance from the heat exchanger inlet.

* * * * *